(12) United States Patent
Zortea et al.

(10) Patent No.: US 6,760,372 B1
(45) Date of Patent: Jul. 6, 2004

(54) ADAPTIVE SIGNAL PROCESSOR USING AN EYE-DIAGRAM METRIC

(75) Inventors: Anthony Eugene Zortea, Pipersville, PA (US); Todd K. Moyer, Aurora, OR (US)

(73) Assignee: 3Com Corporation, Santa Clara, CA (US)

( * ) Notice: Subject to any disclaimer, the term of this patent is extended or adjusted under 35 U.S.C. 154(b) by 877 days.

(21) Appl. No.: 09/636,290

(22) Filed: Aug. 10, 2000

(51) Int. Cl.[7] .............................. H03H 7/30; H03H 7/40; H03K 5/159
(52) U.S. Cl. ..................... 375/232; 375/350; 708/300
(58) Field of Search .................. 375/229, 230, 375/232, 285, 346, 348, 350, 286; 708/300, 322, 323

(56) References Cited

U.S. PATENT DOCUMENTS 3,676,699 A * 7/1972 Warren ........................ 327/34

4,774,682 A * 9/1988 White ........................ 702/109

* cited by examiner

Primary Examiner—Jean B. Corrielus
(74) Attorney, Agent, or Firm—Michaelson & Associates; Peter L. Michaelson

(57) ABSTRACT

The invention is embodied in an adaptive filtering system for processing a received signal, including a signal processor having plural states to generate a processed signal from the received signal in accordance with a selected one of the states. A slicer produces from the processed signal a pulse signal as an output signal of said adaptive filtering system. A eye-diagram calculator produces from the pulse signal a metric signal corresponding to a minimal separation between leading and trailing edges of a succession of n pulses in the pulse signal superimposed upon one another within a repetitive sampling window. An adaptive controller responsive to the metric signal finds the one state of the signal processor that optimizes the metric signal, and places the signal processor into that state.

26 Claims, 10 Drawing Sheets

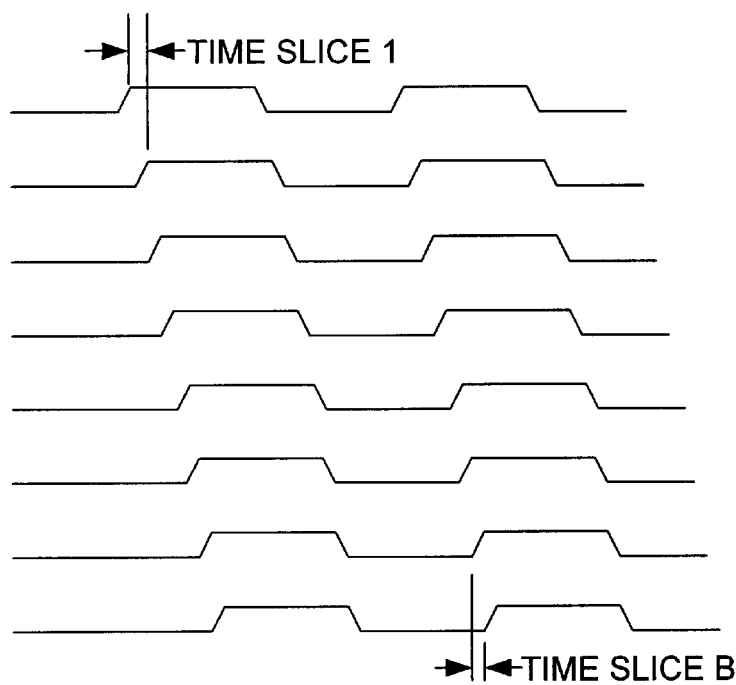

ADAPTIVE SIGNAL PROCESSOR USING AN EYE-DIAGRAM METRIC

BACKGROUND OF THE INVENTION

1. Technical Field

The invention is related to signal processing employing adaptive filters such as equalizers, crosstalk cancellers, echo cancellers, and the like.

2. Background Art

Signal processing employing adaptive filters involves a signal processor having a number of selectable states in which a received signal is processed differently depending upon the state of the signal processor. A suitable feedback algorithm is employed to select the state of the signal processor so as to optimize some measured parameter of the processed signal or to minimize an error. If, for example, the low pass filtering effects of a local area network (LAN) cable are to be removed, then the signal processor may be an adaptive equalizer whose selectable states correspond to different coefficients in a digital FIR filter, or different capacitance values to which an analog equalizer may be set. If the effects of near end crosstalk are to be minimized, then the signal processor is a near end cross talk canceller, for example. The feedback algorithm may be a least mean square algorithm. Alternatively, it may be a genetic algorithm in which each state of the processor is enabled in turn while the signal processor outputs for each state are compared with one another to determine which state produced the best results.

SUMMARY OF THE INVENTION

The invention is embodied in an adaptive filtering system for processing a received signal, including a signal processor having plural states to generate a processed signal from the received signal in accordance with a selected one of the states. The processed signal can be either analog or digital. In either case, the processed signal is a many-leveled signal. A slicer produces from the many-leveled processed signal a few-leveled pulse signal (in the simplest case, two levels, a "0" or a "1") as an output signal of said adaptive filtering system. An eye-diagram calculator produces from the pulse signal a metric signal corresponding to the separation between leading and trailing edges of a succession of n pulses in the pulse signal superimposed upon one another within a repetitive sampling window. The graphical representation of these superimposed pulses is known as an "eye-diagram" and the separation is qualitatively referred to as the "eye-opening." An adaptive controller responsive to the metric signal finds the one state of the signal processor that optimizes the metric signal, and places the signal processor into that state.

In a preferred embodiment, the eye-diagram calculator works as follows: The slicer output, or pulse signal, is used to sample n equally spaced 50% duty cycle clock signals that are frequency locked or nearly-locked to the pulse signal. Each pulse signal edge therefore produces a vector of n samples, each sample will be a 0 or a 1. A plurality of these n element vectors is summed to produce a vector of n sums. The eye-diagram calculator then computes a metric based upon the contrast between the maximum sum of n/2 contiguous sums and the sum of the remaining n/2 contiguous sums in the n-element vector. The contrast may be defined as a difference or a ratio between the two cumulative sums.

BRIEF DESCRIPTION OF THE DRAWINGS

FIGS. 2A–2K are time domain waveforms illustrating one aspect of the operation of an embodiment of the invention.

DETAILED DESCRIPTION OF THE PREFERRED EMBODIMENTS

Figure 1:
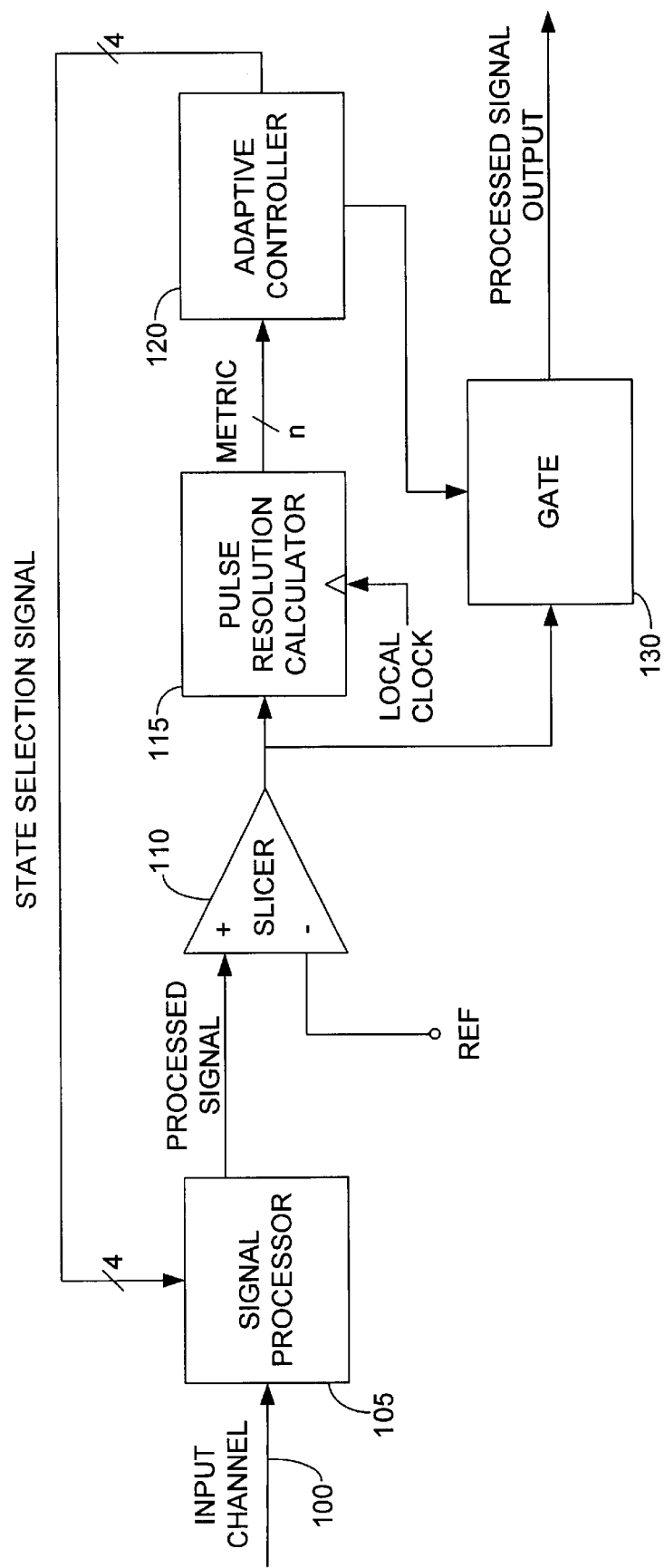
FIG. 1 is a block diagram of a system of one embodiment of the invention.

FIG. 1 illustrates a system embodying the invention. In FIG. 1, an input channel 100 (such as a coaxial cable) carries a received signal to a signal processor 105. The signal processor 105 may be, for example, an equalizer that provides a reactance that compensates for distortions of the received signal caused by stray reactances and other characteristics of the coaxial cable 100. The signal processor 105 is in a selected one of a number of predetermined states. For example, if the signal processor 105 is an equalizer, then each state may correspond to a different reactance. The processed signal thus provided at the output of the signal processor 105 is compared by a slicer 110 with a reference voltage, the slicer 110 outputting either a logic HIGH or a logic LOW depending upon whether the voltage of the signal is above or below the reference voltage.

Figure 2A:
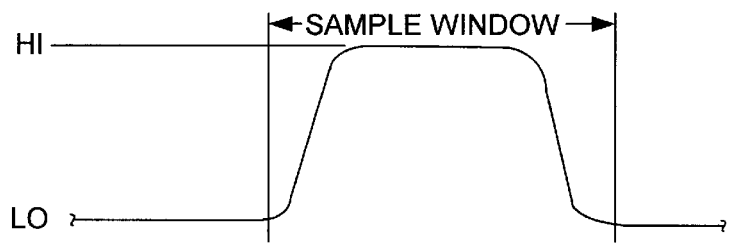
Figure 2B:
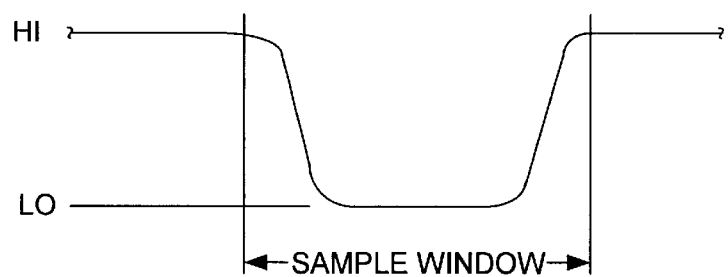

The error in selecting the optimum state of the signal processor is determined by a eye-diagram calculator 115. The eye-diagram metric calculator 115 computes a metric corresponding to the separation between pulse edges of a series of successive pulses superimposed on one another in accordance with a periodic sampling rate corresponding to the pulse rate. The concept is illustrated in FIGS. 2A–2K. FIG. 2A illustrates a pulse signal captured during a sample window and consisting of a logic HI state preceded and followed by logic LO states. FIG. 2B illustrates a pulse signal captured during another sample window of the same duration consisting of a logic LO state preceded and followed by logic HI states. The two sample windows are displaced in time by an integral number of periods of the pulse signal. Superimposing the signal images captured in successive sample windows results in the waveforms of FIG. 2C. The superimposed waveform image of FIG. 2C corresponds to an oscilloscope trace, in which the oscilloscope is triggered by a clock locked the transmitting source generating the input signal 100. However, the clock used to trigger this imaginary oscilloscope is not available in our system, and an object of the present invention is "measure" this eye-diagram without necessarily the aid of the triggering clock.

Figure 2C:
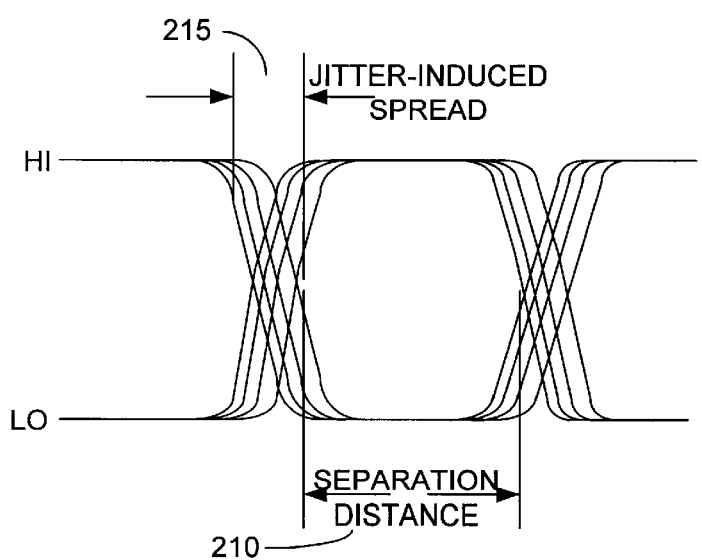

The separation distance 210 denoted in FIG. 2C is the minimum separation between leading and trailing edges of successive pulses superimposed upon one another. Jitter in the received signal will cause the leading edges of different pulses to be at least slightly spread out from one another by a jitter-induced spread distance 215 in the superimposed image of FIG. 2C. Such jitter-induced spread represents a diffusion of the edges and therefore a loss of resolution or degradation of the signal. The greater the jitter-induced spread distance 215, the smaller the separation distance 210 between leading and trailing edges and the poorer the signal resolution. In fact, if the jitter is so severe that the separation distance is zero, there is no resolution between leading and trailing edges and the signal is lost. Therefore, the separation distance is a measure of the resolution of the signal. The state of the signal processor may be judiciously selected to some optimum state that maximizes the separation distance.

The eye-diagram calculator 115 outputs a metric signal whose magnitude represents a metric corresponding to the separation distance of FIG. 2C. This metric is used by an adaptive controller 120 to determine the optimum state of the signal processor 105, and to set the signal processor to this optimum state. As a result the signal quality is optimum. The adaptive controller deduces the optimum signal processor state by observing the behavior of the metric signal over various states of the signal processor 105.

In the preferred embodiment, the eye-diagram calculator 115 generates N equally spaced clocks that are derived from its local clock input. Each of these N clocks is sampled by the output of slicer 110, producing an N-element vector of 0's and 1's. Many, say 64, of these N-element vectors are summed, producing another N-element vector of sums or amplitudes. Then, the eye-diagram calculator 115 intelligently sorts the N cumulative amplitudes into two groups of N/2 consecutive cumulative amplitudes. There are N possible groupings, but the resolution calculator 115 selects the one grouping having the greatest contrast between the two groups. In the preferred embodiment, this contrast is the difference between the sums of the cumulative amplitudes of each group. Preferably, this difference is the metric signal produced by the eye-diagram calculator 115. In an alternative embodiment, the contrast is the ratio between the sums of the cumulative amplitudes of each group, and this ratio is output as the metric signal.

Figure 3A:
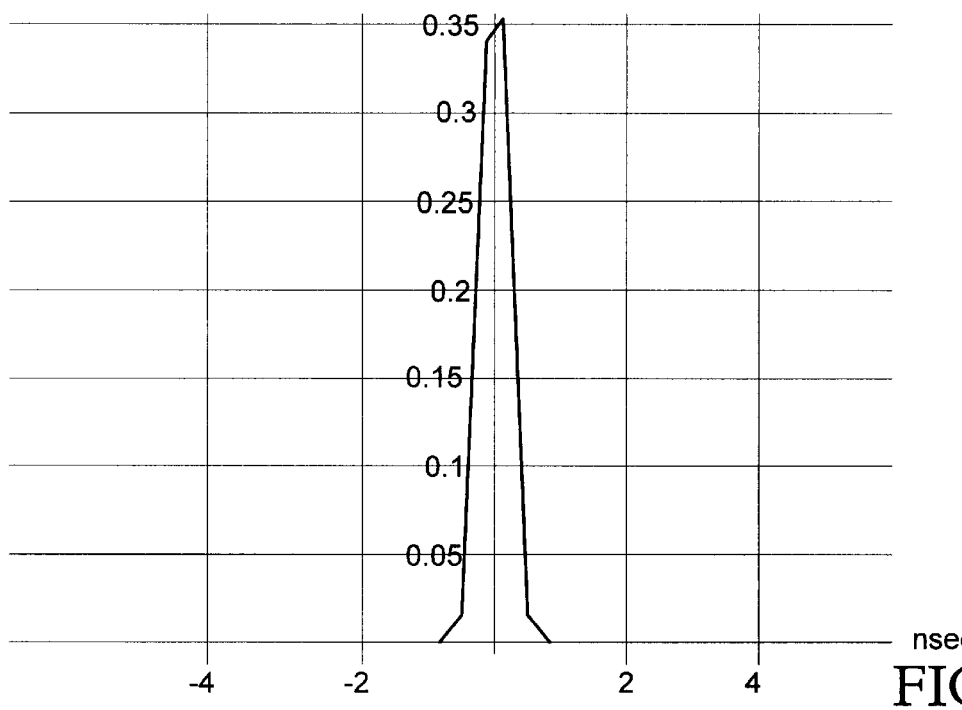
FIG. 3A is a histogram of edges illustrating one aspect of the invention.
Figure 3B:
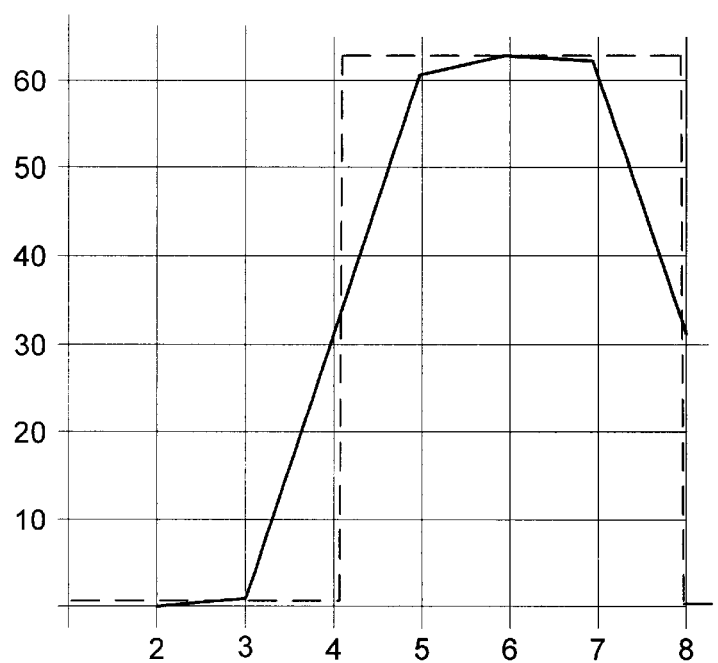
FIG. 3B is illustrates a cumulative sum of edges corresponding generally to FIG. 3A.

In one example, the slicer output is used to sample eight evenly shifted clock signals (so that N=8) as illustrated in FIGS. 2D–2K. 64 of these 8-element sample vectors are summed to produce eight cumulative amplitudes. These cumulative amplitudes may be plotted as a histogram of amplitudes, as in FIG. 3A. In the example of FIG. 3A, the received signal has relatively little jitter, so that successive edges are closely grouped around a common sample time (0), with about 35% of the edges occurring at time 0. FIG. 3B illustrates the cumulative sums plotted as a function of the clock positions in an example in which the eight cumulative sums were as follows:

{0, 0, 0, 1, 32, 62, 64, 32} where a logic HI amplitude is 1 and a logic LO amplitude is 0. A corresponding plot in the case of a signal having zero jitter is shown in dashed line in FIG. 3B, in which case the cumulative sums would be as follows:

{0, 0, 0, 0, 64, 64, 64, 64}

In the first example, the metric is 189 while in the second example the metric is 256, indicating a much wider separation distance in the superimposed image of FIG. 2C and therefore better signal quality.

Figure 4:
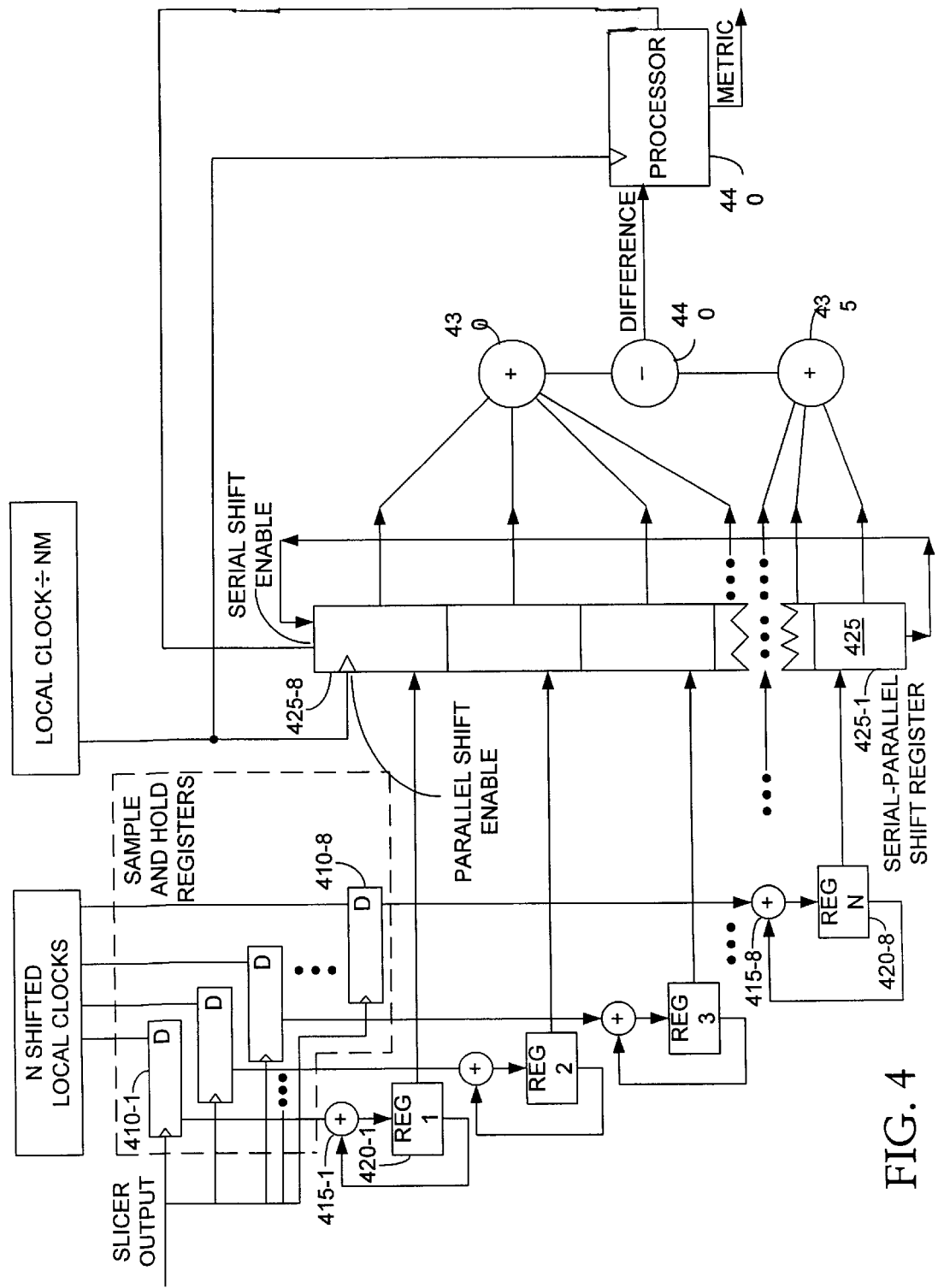
FIG. 4 is a block diagram including a metric processor of the invention.

FIG. 4 illustrates one embodiment of the eye-diagram calculator. The output of the slicer 110 is applied in parallel to the clock input of N D-flip-flops (DFF)410-1 through 410-8. Each DFF 410 samples its respective version of the shifted local clock at the edge of the slicer output. In the example of FIG. 4, N=8. The output of DFF 410 is applied to one input of a corresponding adder 415. The output of the adder 415 is applied to an accumulate register 420 whose output is fed back to the other input of the adder 415. After an appropriate number (M) of slicer output edges, each accumulate register 415 holds a fairly large sum. At this time, therefore, all of the accumulate registers 415 write their contents to corresponding word locations in a serial-parallel shift register 425.

The serial-parallel shift register 425 is divided into word cells 425-1 through 425-N, each word cell receiving the output of a corresponding accumulate register 420 at the end of M sample windows. For this purpose, the parallel shift enable input 425a of the serial-parallel shift register 425 is strobed with a version of the local clock signal with frequency divided by N times M. After the N cumulative amplitudes are loaded into corresponding word cells 425-1 through 425-8, the contents of the shift register 425 are serially shifted word-by-word. With each shift, adders 430 and 435 compute the sums of the contents of respective halves of the shift register 425, and a subtractor 440 computes the difference between the two sums. (Alternatively, a divider may be employed in lieu of the subtractor to produce a ratio instead of a difference.) A processor 450 stores each difference. After N serial shifts of the shift register 425, all possible groupings of the cumulative amplitudes have been made, and therefore the processor 450 chooses the largest difference and outputs that as the metric. The advantage is that no information is required regarding the location of the edges with respect to the N-shifted local clocks in order to obtain the correct grouping of the cumulative amplitudes.

Figure 5:
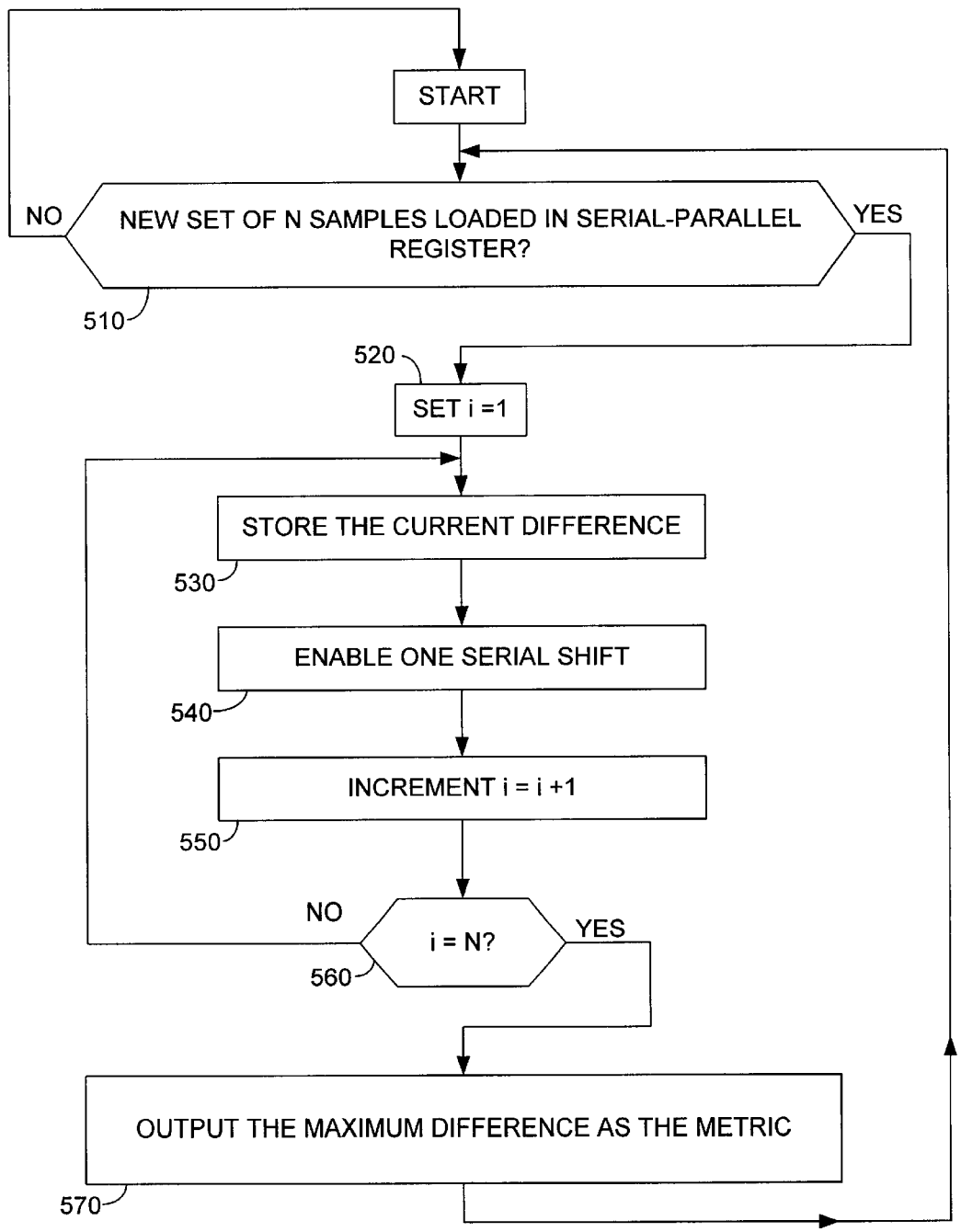
FIG. 5 is a flow diagram illustrating an operation of the apparatus of FIG. 4.

FIG. 5 illustrates the operation that the processor 450 is programmed (or hardwired) to carry out. After M slicer output edges, N new cumulative amplitudes have been loaded into the N respective word cells 425-1 through 425-8 of the serial-parallel shift register (block 510 of FIG. 5), an index i is initialized at 1 (block 520 of FIG. 5) and the difference now appearing at the output of the subtractor 440 is stored (block 430). Then, the serial-parallel shift register 425 is serially shifted by one word cell (block 540) and the index i is incremented (block 550). If the index i has not reached N (NO branch of block 560) the process is repeated beginning at block 430. Otherwise, i=N (YES branch of block 560), and there are N differences corresponding to the N serial shifts of the register 425, in which case the processor 450 chooses the largest difference and outputs that as the metric (block 570).

The adaptive controller 120 may control the state of the signal processor 105 to maximize the metric using any suitable algorithm, such as the least mean square algorithm, or a simple genetic algorithm. In the genetic algorithm, during a trial-and-error period each and every state of the signal processor 105 is tried for each sample window, and the state resulting in the greatest metric is chosen. During the trial and error period, as the signal processor 105 runs through all its states, the output of the slicer 110 is blocked by a gate 130, since the optimum state is not yet known. However, once the optimum state has been found, the signal processor 105 is set to that optimum state and the resulting output of the slicer is admitted by the gate 130 as the output of the system.

Figure 6:
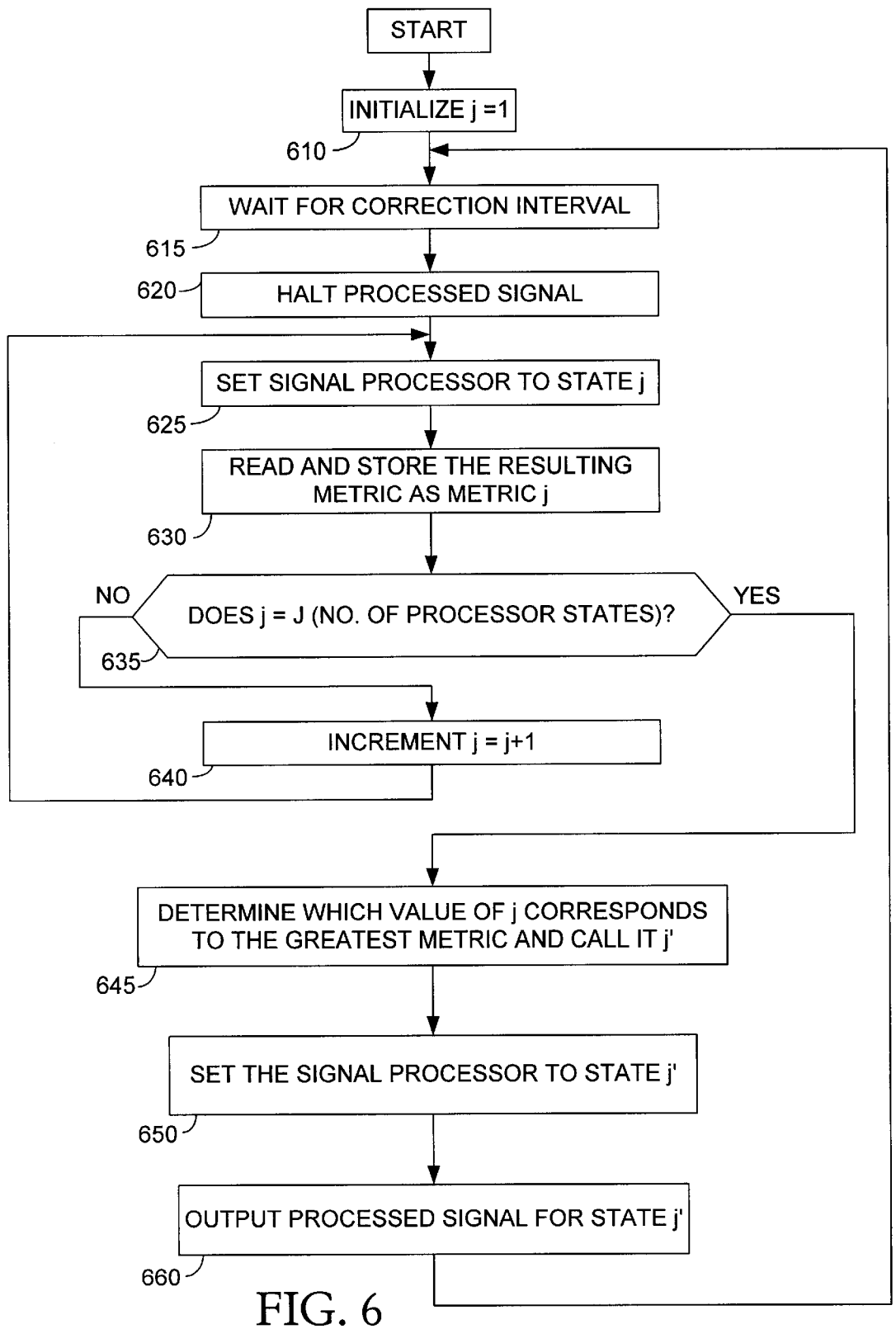
FIG. 6 is another flow diagram illustrating another operation of the apparatus of FIG. 4.

FIG. 6 illustrates how the adaptive controller performs the genetic algorithm in carrying out the invention. First, an index j is initialized to 1 (block 610 of FIG. 6). Then, after an appropriate interval (block 615), the output of the slicer 110 is stopped at the gate 130 (block 620). The processor 105 is set to state j (block 625) and the resulting metric from the resolution calculator 115 is stored (block 630). If j has net yet reached the number of states of the processor 105 (NO branch of block 635), then j is incremented (block 640), and the process repeats beginning with block 625. Otherwise, if j has reached the number of states of the processor 105, all of the states have been tried and the controller 120 determines the value of j associated with the greatest metric (block 645) and sets the processor 105 to this state (block 650). The output from the slicer 110 resulting from this optimum state of the signal processor 105 is then admitted through the gate 130 as the processed signal (block 660 of FIG. 6). This concludes one cycle of the process, and it returns to the step of block 615.

As described above with reference to FIG. 1, the signal processor 105 may be of any type having a number of states, at least one of which tends to enhance the signal quality. Specifically, it should increase the resolution metric computed by the eye-diagram calculator 115. One example of such a signal processor is an equalizer that has a reactance tending to compensate for characteristics of the coaxial cable 100. The equalizer has a number of selectable states corresponding to different reactances that the equalizer may impose on the signal.

Figure 7:
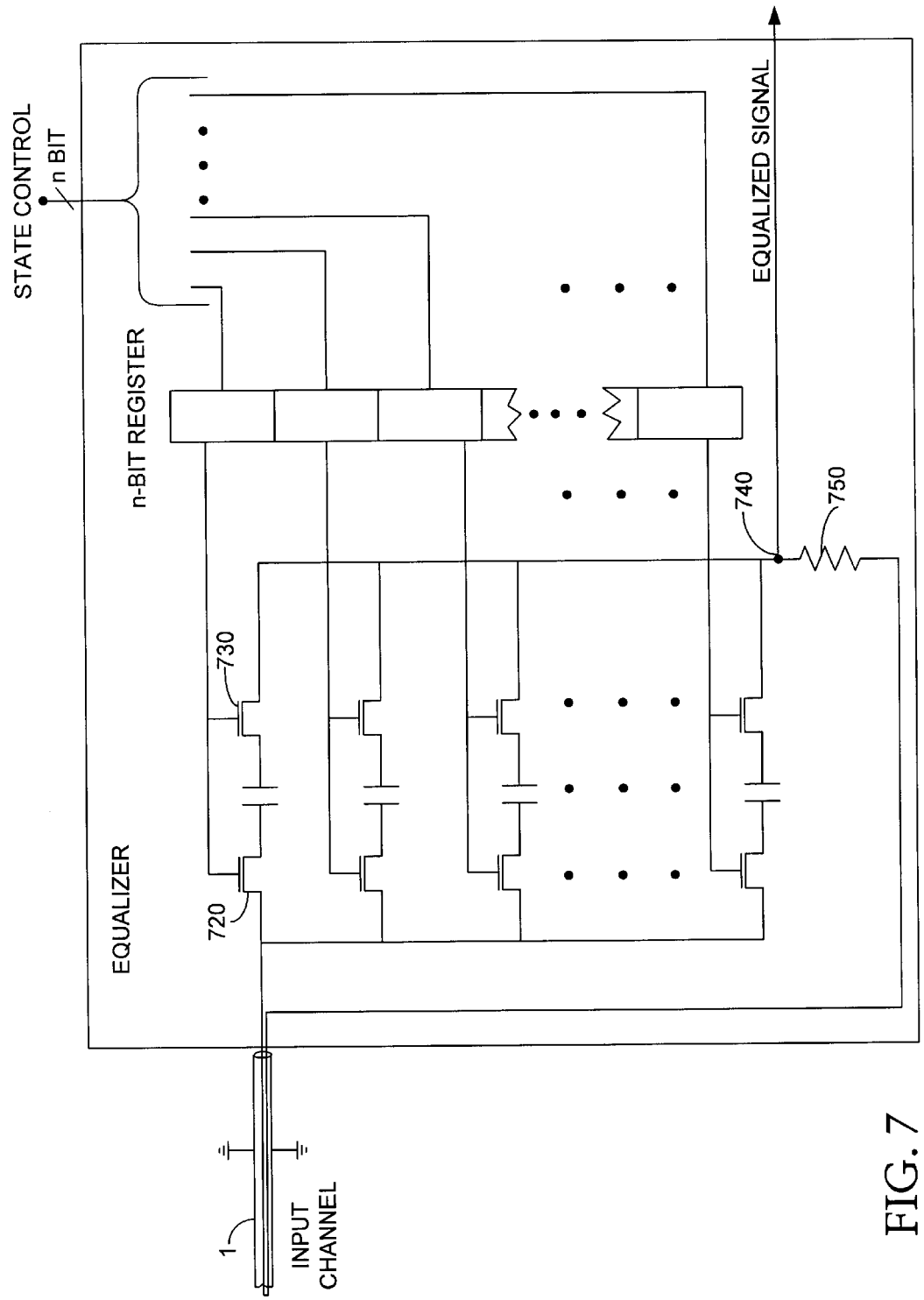
FIG. 7 is a schematic diagram illustrating an equalizer that can be employed in an embodiment of the invention.

FIG. 7 illustrates one example of the signal processor 105 implemented as such an equalizer. In FIG. 7, the signal processor 105 has a set of n capacitors 710 connected between respective transistor switches 720 and 730. The switches 720 are connected to the input channel 100 while the switches 730 are connected to the output 740 of the signal processor 105. A load resistor 750 is connected across the output 740 and ground. An n-bit register 760 has n outputs connected to the gates of respective pairs of the switches 720, 730. Each bit of the register 760 closes or opens the corresponding switch pair 720, 730 depending upon whether the bit is a logic HI or a logic LO. Thus, each of the n bits of the register 760 determines whether the corresponding capacitor 710 contributes to the capacitance between the input channel 100 and the signal processor output 740. The state selection signal produced by the adaptive controller 120 is an n-bit word which is written to the n-bit to the n inputs of the n-bit register 760. The states of the signal processor of FIG. 7 are realized by applying many or all possible binary n-bit combinations to the register 760. Thus, in the process of FIG. 6, each state j selected by the adaptive controller 120 corresponds to a different n-bit word written to the register 760. Similar implementations for digital filters are also possible.

Figure 8:
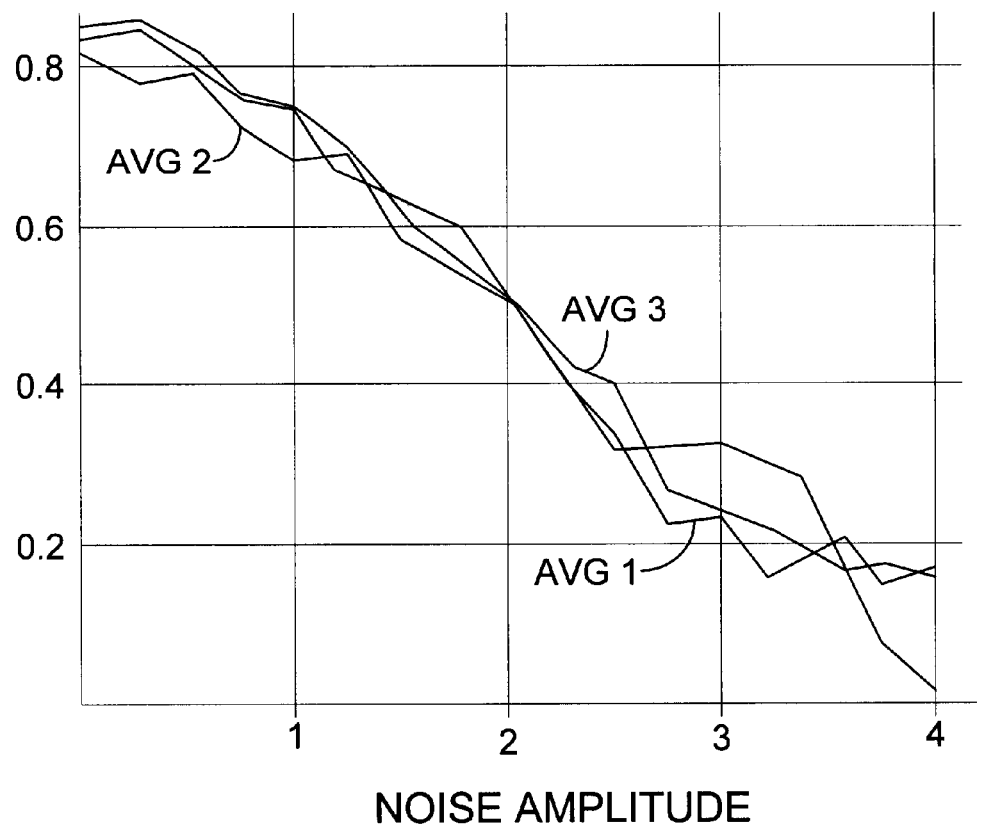
FIG. 8 is a time domain diagram illustrating one aspect of performance of an embodiment of the invention.

FIG. 8 is a graph of the metric signal produced by the resolution calculator 115 as a function of uniform noise. The graph of FIG. 8 was obtained in a simulation in which white noise was superimposed on an exemplary pulse signal. The metric (vertical axis of FIG. 8) was computed at different noise levels (horizontal axis of FIG. 8). FIG. 8 shows that as the signal quality increases (from right to left along the horizontal axis of FIG. 8), the metric increases. This indicates that the metric computed by the resolution calculator 115 is a reliable indicator of signal quality.

While the invention has been described in detail with reference to a preferred embodiment in which the signal processor 115 is an equalizer, the signal processor may be any type of adaptive filter requiring its state to be selected by an intelligent device such as the adaptive controller 120. Thus, the signal processor may be an equalizer, a near-end crosstalk canceller, an echo canceller, digital filter or the like. A system in which the adaptive controller 120 selects the optimum state of a feed forward signal processor 910, a cancellation filter 920 and a digital filter 930. The feed forward signal processor 910 may be the equalizer 105 of FIG. 1. The cancellation filter 920 may be a near end crosstalk (NEXT) canceller or an echo canceller or the like.

The digital feedback filter 930 employs a suitable digital algorithm having a choice of states which is optimized by the adaptive controller. For example, each state may correspond to a differently weighted FIR or IIR filter. The digital filter 930 has a signal input 930-1 connected to the output of the slicer 110 and a signal output 930-2. An adder 940 has one input connected to the digital filter signal output 930-2 and another input connected to the output of the feed forward signal processor or equalizer 910. One state selection signal from the adaptive controller 120 controls the state of the digital feedback filter 930.

The cancellation filter 920 may be a near end crosstalk (NEXT) canceller. In this case its choice of states correspond to different delays it imposes in the superposition of another signal that is the source of the crosstalk, as described in co-pending U.S. application Ser. No. 09/636,042 filed Aug. 10, 2000 and assigned to the present assignee, the disclosure of which is incorporated by reference. A separate state selection signal from the adaptive controller 120 controls the state of the cancellation filter 920.

The feed forward processor 910 may be an equalizer. How the adaptive controller governs the choice of states of the equalizer is described above with reference to FIG. 7.

Figure 9:
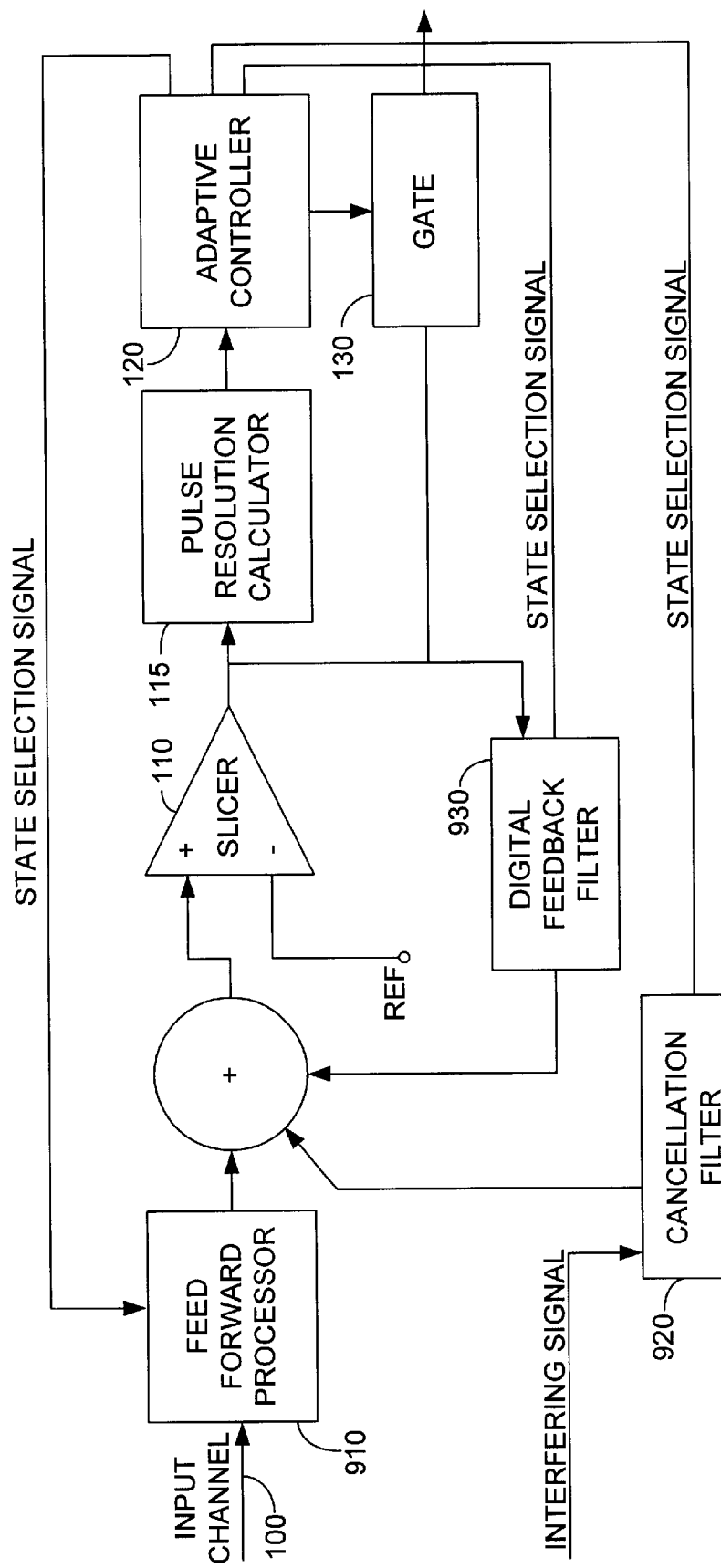
FIG. 9 is a block diagram illustrating a system embodying one aspect of the invention.

Operation of the system of FIG. 9 using the single adaptive controller 120 to control the three multi-state filters 910, 920, 930 may be accomplished by optimizing each filter 910, 920, 930 individually, one at a time, using the method described above with respect to FIG. 6. That is, the states of the digital feedback filter 930 and of the cancellation filter 920 would be held constant while the adaptive controller 120 performs the process of FIG. on the feed forward filter 910 only. Then, the states of the digital feedback filter 930 and of the feed forward filter 910 would be held constant while the adaptive controller 120 performs the process of FIG. 6 on the cancellation filter 920. Finally, the states of the cancellation filter 920 and of the feed forward filter 910 would be held constant while the adaptive signal processor 120 performs the process of FIG. 6 on the digital feedback filter 930.

While the invention has been described in detail by specific reference to preferred embodiments, it is understood that variations and modifications may be made without departing from the true spirit and scope of the invention.

What is claimed is:

1. An adaptive filtering system for processing a received signal, comprising:

a signal processor having plural states, said received signal being applied to an input of said signal processor, said signal processor generating a processed signal in accordance with a selected one of said states;

a slicer connected to receive said processed signal for producing a pulse signal from said processed signal as an output signal of said adaptive filtering system;

a eye-diagram calculator connected to receive said pulse signal for producing a metric signal which is a function of a minimal separation between leading and trailing edges of a succession of n pulses in said pulse signal superimposed upon one another within a repetitive sampling window;

an adaptive controller responsive to said metric signal for determining one of said plural states of said signal processor that optimizes said metric signal, and for causing said signal processor to be in said one state.

2. The system of claim 1 wherein said eye-diagram calculator comprises:

means for dividing each of said succession of pulses in to a plurality of n samples;

means for adding said succession of pulses sample-wise to produce a vector of n sums;

means for finding a grouping of said n sums into two sets of n/2 sums each and having a maximum contrast between the two groups; and means for computing a metric based upon the contrast between the cumulative sums of the n/2 sums in each group.

3. The system of claim 2 wherein said contrast is the difference between cumulative sums of the n/2 sums in each group.

4. The system of claim 2 wherein said contrast is the ratio between cumulative sums of the n/2 sums in each group.

5. The system of claim 2 wherein said adaptive controller comprises means for observing changes in said metric resulting from changes in said states of said signal processor and deducing therefrom an optimum one of said states.

6. The system of claim 5 wherein said means for observing and deducing comprise means for performing a least mean squares algorithm.

7. The system of claim 5 wherein said means for observing and deducing comprise means for performing a genetic algorithm.

8. The system of claim 7 wherein said observing and deducing means comprises:

means for successively selecting plural states of said signal processor;

means for comparing the metric signal obtained for each of said plural states and for deducing therefrom the state corresponding to the optimum metric signal.

9. The system of claim 8 wherein said signal processor comprises an equalizer having plural states corresponding to different reactances of said equalizer.

10. The system of claim 8 wherein said signal processor comprises a digital filter having plural states corresponding to different weights of an FIR or IIR filter.

11. The system of claim 8 wherein said signal processor comprises a cancellation filter having plural states corresponding to different delays of an interfering signal superimposed on said received signal.

12. An adaptive filtering system for processing a received signal, comprising:

a signal processor having plural states, said received signal being applied to an input of said signal processor, said signal processor generating a processed signal corresponding to a pulse signal in accordance with a selected one of said states;

a slicer having an input receiving said processed signal and an output producing a succession of edges;

a metric processor comprising:

(a) n equally spaced clocks each sampled by an edge of the slicer output producing successive n-element vectors;

(b) an adder for adding said n-element vectors sample-wise to produce a vector of n sums;

(c) decision logic for finding a grouping of said n sums into two sets of n/2 sums each and having a maximum contrast between the two groups, and for outputting said maximum contrast as a metric signal; and an adaptive controller responsive to said metric signal for determining one of said plural states of said signal processor that optimizes said metric signal, and for causing said signal processor to be in said one state.

13. The system of claim 12 wherein said decision logic comprises:

a parallel serial shift register having n cells which receive in parallel said n sums;

first and second adders connected to respective first and second groups of the n cells of said parallel shift register, each group constituting n/2 of said cells whereby to form respective first and second cumulative sums of the contents of said first and second groups of n/2 cells;

a subtractor connected to said first and second adders for computing a difference between said first and second cumulative sums;

shift logic for serially shifting the cells of said parallel serial register whereby to produce plural respective differences corresponding to plural serial shifts of said register, the greatest one of said differences corresponding to said metric signal.

14. The system of claim 12 wherein said decision logic comprises:

a parallel serial shift register having n cells which receive in parallel said n sums;

first and second adders connected to respective first and second groups of the n cells of said parallel shift register, each group constituting n/2 of said cells whereby to form respective first and second cumulative sums of the contents of said first and second groups of n/2 cells;

a divider connected to said first and second adders for computing a ratio between said first and second cumulative sums;

shift logic for serially shifting the cells of said parallel serial register whereby to produce plural respective ratios corresponding to plural serial shifts of said register, a minimum or maximum one of said ratios corresponding to said metric signal.

15. The system of claim 12 wherein said adaptive processor comprises a state selection signal output connected to said signal processor to controllably change the state of said processor.

16. The system of claim 15 wherein said adaptive signal processor comprises means for selecting a plurality of states of said signal processor to produce a corresponding plurality of metric signals, wherein said optimum state corresponds to the maximum one of said plurality of metric signals.

17. The system of claim 12 wherein said signal processor comprises an equalizer and the states of said signal processor correspond to different reactances of said equalizer.

18. The system of claim 12 wherein said signal processor comprises a digital filter.

19. The system of claim 12 wherein said signal processor comprises a cancellation filter.

20. A method of optimizing the selection of the state of a multi-state signal processor in an adaptive filtering system that filters a received signal, said signal processor producing a processed signal corresponding to a pulse signal, said method comprising:

for producing from said pulse signal a metric signal which is a function of a minimal separation between leading and trailing edges of a succession of n pulses in said pulse signal superimposed upon one another within a repetitive sampling window;

observing said metric signal while changing the state of said signal processor and determining therefrom one of said plural states of said signal processor that optimizes said metric signal, and causing said signal processor to be in said one state.

21. The method of claim 20 the step of producing a metric signal comprises:

dividing each of said succession of pulses in to a plurality of n samples;

adding said succession of pulses sample-wise to produce a vector of n sums;

finding a grouping of said n sums into two sets of n/2 sums each and having a maximum contrast between the two groups; and computing a metric based upon the contrast between the cumulative sums of the n/2 sums in each group.

22. The method of claim 21 wherein said contrast is the difference between cumulative sums of the n/2 sums in each group.

23. The method of claim 21 wherein said contrast is the ratio between cumulative sums of the n/2 sums in each group.

24. The method of claim 21 wherein the steps of observing and determining comprise performing a least mean squares algorithm.

25. The method of claim 21 wherein the steps of observing and determining comprise performing a genetic algorithm.

26. The method of claim 25 wherein the steps of observing and determining comprise:

successively selecting plural states of said signal processor;

comparing the metric signal obtained for each of said plural states and for deducing therefrom the state corresponding to the optimum metric signal.

* * * * *